US 6,633,421 B2

(12) United States Patent
Trezza

(10) Patent No.: US 6,633,421 B2
(45) Date of Patent: Oct. 14, 2003

(54) INTEGRATED ARRAYS OF MODULATORS AND LASERS ON ELECTRONICS

(75) Inventor: John Trezza, Nashua, NH (US)

(73) Assignee: Xanoptrix, Inc., Merrimack, NH (US)

( * ) Notice: Subject to any disclaimer, the term of this patent is extended or adjusted under 35 U.S.C. 154(b) by 0 days.

(21) Appl. No.: 10/180,610

(22) Filed: Jun. 26, 2002

(65) Prior Publication Data

US 2003/0039282 A1 Feb. 27, 2003

Related U.S. Application Data

(63) Continuation-in-part of application No. 09/896,189, filed on Jun. 29, 2001, and a continuation-in-part of application No. 09/897,160, filed on Jun. 29, 2001, and a continuation-in-part of application No. 09/896,983, filed on Jun. 29, 2001, and a continuation-in-part of application No. 09/897,158, filed on Jun. 29, 2001, and a continuation-in-part of application No. 09/896,665, filed on Jun. 29, 2001.

(60) Provisional application No. 60/365,998, filed on Mar. 19, 2002, and provisional application No. 60/366,032, filed on Mar. 19, 2002.

(51) Int. Cl.[7] .......................... H01L 21/00; H04B 10/04
(52) U.S. Cl. .......................... 359/180; 438/29; 438/26; 438/24
(58) Field of Search ................ 438/24, 26, 27, 438/28, 23, 29; 372/26, 38.02, 50; 359/180, 159, 163

(56) References Cited

U.S. PATENT DOCUMENTS

| | | | |
|---|---|---|---|
| 4,533,833 A | 8/1985 | Copeland et al. | |
| 5,266,794 A | 11/1993 | Olbright et al. | |
| 5,269,453 A | 12/1993 | Melton et al. | |
| 5,385,632 A | 1/1995 | Goossen | |
| 5,477,933 A | 12/1995 | Nguyen | |
| 5,793,789 A | 12/1995 | Ben-Michael et al. | |
| 5,488,504 A | * 1/1996 | Worchesky et al. | 359/248 |
| 5,568,574 A | * 10/1996 | Tanguay, Jr. et al. | 385/14 |
| 5,636,052 A | * 6/1997 | Arney et al. | 359/291 |
| 5,729,038 A | 3/1998 | Young et al. | 257/460 |
| 5,912,997 A | 6/1999 | Bischel et al. | |
| 5,946,130 A | 8/1999 | Rice | 359/349 |
| 5,991,479 A | 11/1999 | Kleinerman | 385/31 |
| 6,005,262 A | 12/1999 | Cunningham et al. | |
| 6,048,751 A | 4/2000 | D'Asaro et al. | |
| 6,118,908 A | * 9/2000 | Bischel et al. | 385/14 |
| 6,136,623 A | 10/2000 | Hofstetter et al. | |
| 6,172,417 B1 | 1/2001 | Goossen | |
| 6,184,066 B1 | 2/2001 | Chino et al. | 438/118 |
| 6,215,114 B1 | 4/2001 | Yagi et al. | |
| 6,253,986 B1 | 7/2001 | Brofman et al. | |
| 6,283,359 B1 | 9/2001 | Brofman et al. | |
| 6,340,113 B1 | 1/2002 | Avery et al. | |
| 6,343,171 B1 | 1/2002 | Yoshimura et al. | 385/50 |
| 6,423,561 B1 | * 7/2002 | Chino et al. | 438/29 |
| 6,522,794 B1 | * 2/2003 | Bischel et al. | 385/4 |
| 2001/0020793 A1 | 9/2001 | Honda | |
| 2001/0038103 A1 | 11/2001 | Nitta et al. | 277/103 |
| 2002/0081773 A1 | 6/2002 | Inoue et al. | |
| 2002/0126364 A1 | * 9/2002 | Miles | 359/247 |
| 2002/0141011 A1 | * 10/2002 | Green et al. | 359/118 |

OTHER PUBLICATIONS

International Search Report dated Oct. 18, 2002.
International Search Report dated Nov. 7, 2002.
International Search Report dated Dec. 17, 2002.

(List continued on next page.)

*Primary Examiner*—Carl Whitehead, Jr.
*Assistant Examiner*—William Vesperman
(74) *Attorney, Agent, or Firm*—Morgan & Finnegan, LLP

(57) ABSTRACT

A unit has an array of lasers having an emission surface through which beams can be emitted in a substantially vertical direction so as to define an emission side, drive electronics connected to a side opposite to the emission side of the array of lasers, and an array of modulators, located on the emission side of the array of lasers and connected to the drive electronics.

18 Claims, 9 Drawing Sheets

OTHER PUBLICATIONS

Ahadian, J. F., et al., "Practical OEIC's Based on the Monolithic Integration of GaAs–InGap LED's with Commercial GaAs VLSI Electronics", IEEE Journal of Quantum Electronics, vol. 34, No. 7, pp. 1117–1123, Jul. 1998.

Alduino, A.C. et al., "Quasi–Planar Monolithic Integration of High–Speed VCSEL and Resonant Enhanced Photodetector Arrays", IEEE Photonics Technology Letters, vol. 11, No. 5, pp. 512–514, May 1999.

Anderson, B., "Rapid Processing And Properties Evaluation Of Flip–Chip Underfills" Dexter Electronic Materials, 9 pages.

Corbett, B. et al., "Resonant Cavity Light Emitting Diode and Detector Using Epitaxial Liftoff", IEEE, vol. 5, No. 9, pp. 1041–1043, Sep. 1993.

Geib, K.M. et al., "Monolithically Integrated VCSELs and Photodetectors for Microsystem Applications", IEEE, pp. 27–28, 1998.

Goodman, J. et al., "Optical Interconnections for VLSI Systems", Proceedings of the IEEE, vol. 72, No. 7, pp. 850–865, Jul. 1984.

Goossen, K. W. et al., "GaAs 850 nm Modulators Solder–Bonded to Silicon", IEEE Photonics Technology Letters, vol. 5, No. 7, Jul. 1993.

Goossen, K. W. et al., "GaAs MQW Modulators Integrated with Silicon CMOS", IEEE Photonics Technology Letters, vol. 7, No. 4, pp. 360–362, Apr. 1995.

Hibbs–Brenner, M.K., et al., "VCSEL/MSM Detector Smart Pixel Arrays", IEEE, pages 3 and 4, 1998.

Lesser, M.P. et al., "Bump Bonded Back Illuminated CCDs", SPIE, vol. 1656, pp. 508–516, 1992.

McLaren T. et al., "Assembly of VCSEL Based Smart Pixel Arrays", IEEE/LEOS Summer Topical Meeting: Smart Pixels, pages 49 and 50, Aug. 1996.

Nakahara, T., et al., "Hybrid Integration of Smart Pixels by Using Polyimide Bonding: Demonstration of a GaAs p–i–n Photodiode/CMOS Receiver", IEEE Journal Of Selected Topics In Quantum Electronics, pp. 209–216, 1999.

Ohsaki, T., "Electronic Packaging in the 1990's –A Perspective From Asia", IEEE Transactions On Components, Hybrids, And Manufacturing Technology, vol. 14, No. 2, pp. 254–261, Jun. 1991.

Pommerrenig, D.H. et al., "Hybrid silicon focal plane development: an update", SPIE, vol. 267, pp. 23–30, 1981.

Pu, R. et al., "Comparison of Techniques for Bonding VCSELs Directly to ICs", SPIE vol. 3490, pp. 498–501, Jun. 2005.

Pu, R. et al., "Hybrid Integration of VCSELs to Foundry Fabricated Smart Pixels", IEEE/LEOS Spring Meetings, pages 25 and 26, 1997.

Sasaki, J. et al., "Self–aligned Assembly Technology for Optical Devices Using AuSn Solder Bumps Flip–Chip Bonding", pp. 260–261.

* cited by examiner

INTEGRATED ARRAYS OF MODULATORS AND LASERS ON ELECTRONICS

CROSS REFERENCE TO RELATED APPLICATIONS

This application claims priority under 35 USC 119(e)(1) of U.S. Provisional Patent Application Ser. No. 60/365,998 and U.S. Provisional Patent Application Ser. No. 60/366,032, both filed Mar. 19, 2002.

This application is a continuation-in-part of commonly assigned U.S. patent application Ser. No. 09/896,189, U.S. patent application Ser. No. 09/897,160, U.S. patent application Ser. No. 09/896,983, U.S. patent application Ser. No. 09/897,158 and U.S. patent application Ser. No. 09/896,665, all filed Jun. 29, 2001.

FIELD OF THE INVENTION

This invention relates to optical devices and, more particularly, to optical devices involving lasers and modulators.

BACKGROUND

External modulation has been used in some semiconductor laser systems where one or a few edge emitting lasers were used in a linear arrangement. Single channel use of modulators with edge emitting lasers in a package is also therefore possible. However, presently, two dimensional arrays of edge emitting semiconductor lasers are not in the prior art, hence integration of modulators with such lasers is not possible in the prior art. In addition, modulators that can be integrated with arrays of vertical emitting format lasers, particularly, vertical emitting cavity, distributed feedback (DFB) lasers and distributed Bragg reflector (DBR) lasers, are not available in the prior art.

SUMMARY OF THE INVENTION

As shown in FIG. 1, we integrate arrays of vertical cavity modulators 100 on top of arrays of lasers 102 which are integrated on top of electronics 104 (one or more chips). By employing the teachings of the invention, we create large laser arrays in which each of the lasers can be operated at constant light output and the output can be switched on an off, very rapidly, via external modulation through integration of the modulator array on top of the laser array. As a result, we can accomplish a number of advantages including switching lasers in a two-dimensional semiconductor laser array at rates both below, and in excess of, 10 Gb/s.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

Figure 1:
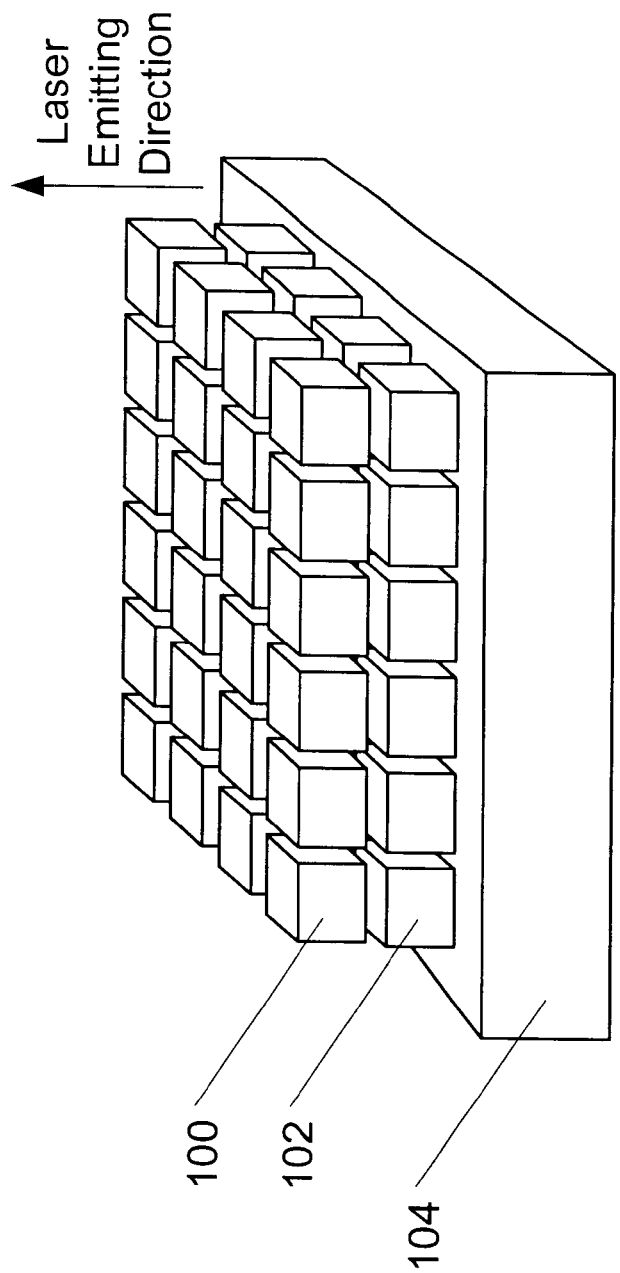
FIG. 1 is a simplified representation of an array of modulators on top of an array of lasers on top of an electronic integrated circuit.

Commonly assigned U.S. patent application Ser. Nos. 09/896,189, 09/897,160, 09/896,983, 09/897,158 and 09/896,665 and U.S. Provisional Patent Application Serial Nos. 60/365,998 and 60/366,032, are all incorporated herein by reference in their entirety, and describe different ways for integrating optical devices, including, but not limited to, vertical cavity surface emitting lasers (VCSELs), distributed feedback (DFB) lasers and distributed Bragg reflector (DBR) lasers, with electronics, irrespective of whether they are top-side or bottom/back-side emitting, to form large optical device arrays and for creating modules incorporating the resulting integrated opto-electronic chips.

At high data rates, for example, about 10 Gb/s or more, it becomes difficult to turn lasers on and off rapidly enough to accomplish data transmission by direct modulation of the lasers. This is because when directly modulating a laser, electrons must be fed into the laser device in order to create light and then pulled out of the laser device to turn off the light during switching. However, this process requires a minimum amount of time and power to execute, due to fundamental physical properties of the laser, such as the capacitance of the device and the decay time constant of electrons in the laser's active region.

As speeds become higher, the required rate of switching approaches, and then eventually exceeds, the minimum time required to do so. As a result, as speeds increase, the process becomes extremely difficult (and eventually impossible) to perform.

As a result, at higher speeds, optical data transmission is often accomplished using what is called "external modulation" in which a lasers remains continuously "on" and a device external to the laser controls the light output. In one type of external modulation, a device known as a "modulator" is placed between the output portion of the laser and the external world. The modulator turns the light on and off thereby creating the effect of turning the laser on and off. A modulator can turn on and off the light, relative to the external world, via a number of mechanisms. For example, a modulator can be transparent in one state and absorptive in another, a modulator can be transparent in one state and reflective in another, a modulator can use changes in refractive index to shift the resonance wavelength of the laser so that the cavity resonant wavelength is no longer on the gain region, or a modulator can be irrelevant to and then disruptive to the optical properties of the laser (for example by changing the effective reflectivity of one of the laser's mirrors in a switchable fashion).

Our aforementioned incorporated applications, described processes that can be also be used to integrate a large array of modulators with an array of active optical devices (e.g. lasers and/or detectors) on an electronic chip.

We specifically describe herein some modulator specific aspects of the previous approaches to ensure that modulators are made compatible with the vertically emitting lasers described therein and to ensure the modulators are made electrical contact compatible with an electronic chip already containing lasers.

Figure 2:
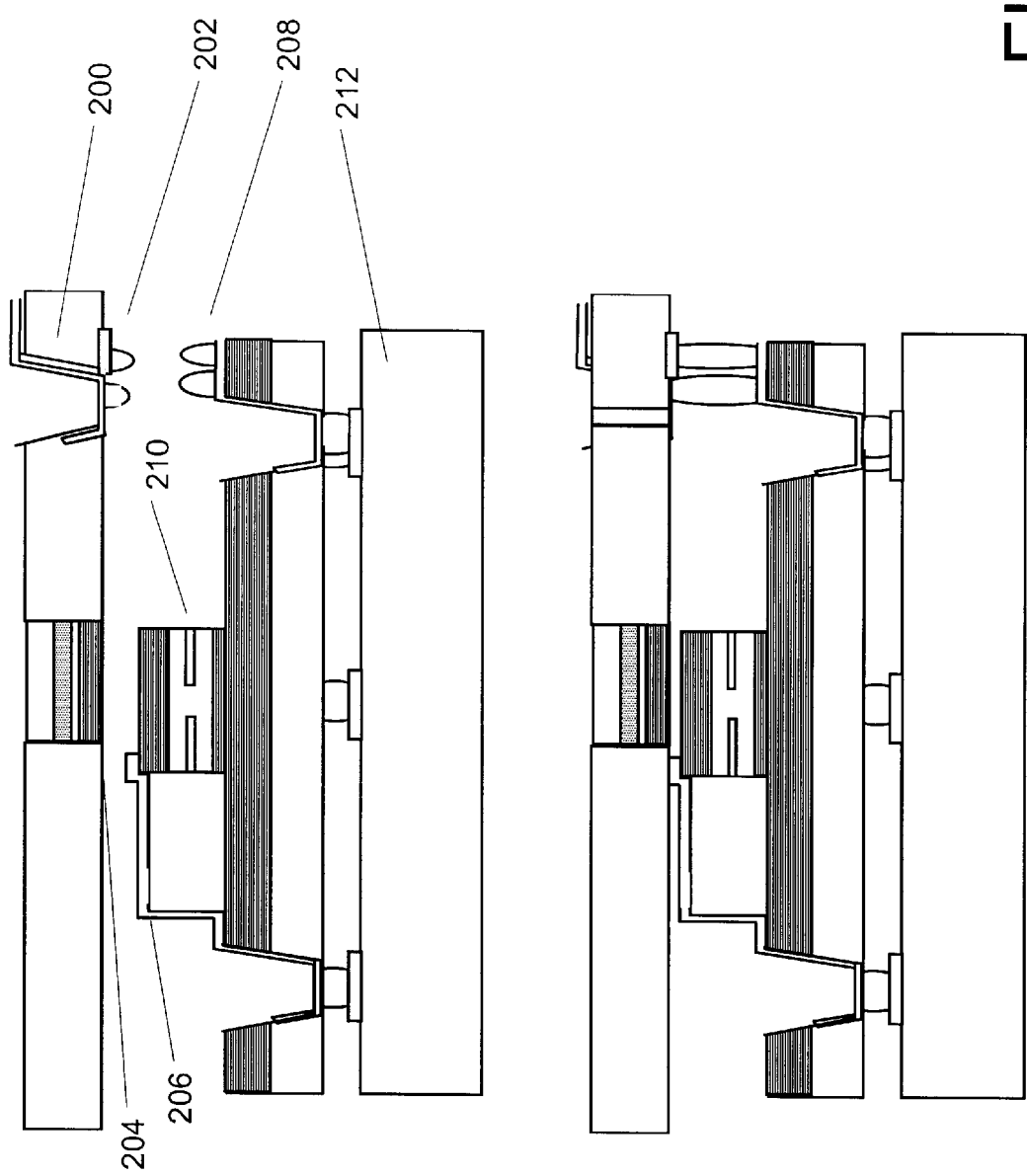
FIG. 2 shows a modulator having connections formed for mating with connections on an example integrated laser device previously integrated with an electronic chip.
Figure 3:
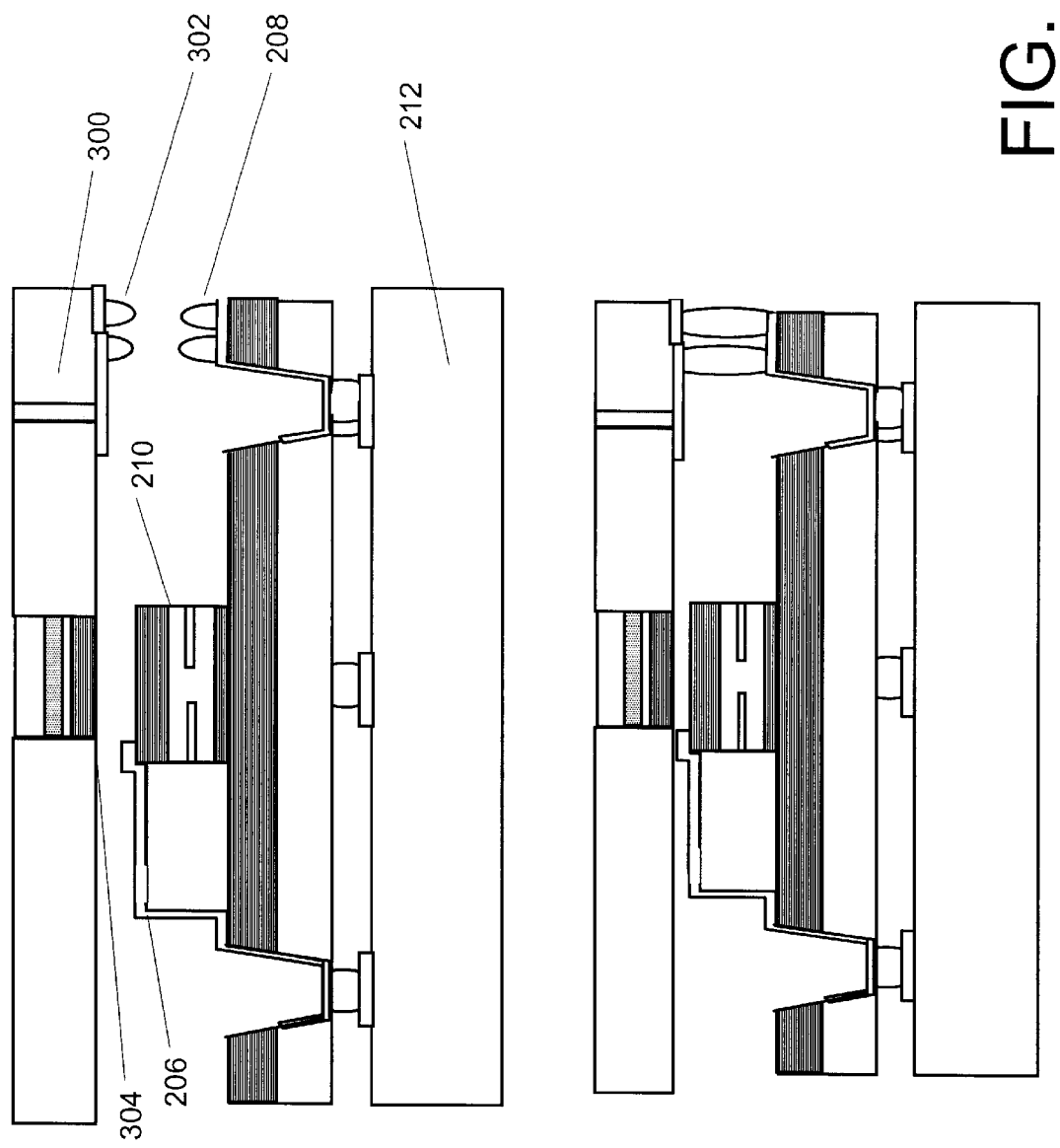
FIG. 3 shows an alternative modulator having connections formed for mating with connections on a laser device using a back side process.
Figure 4:
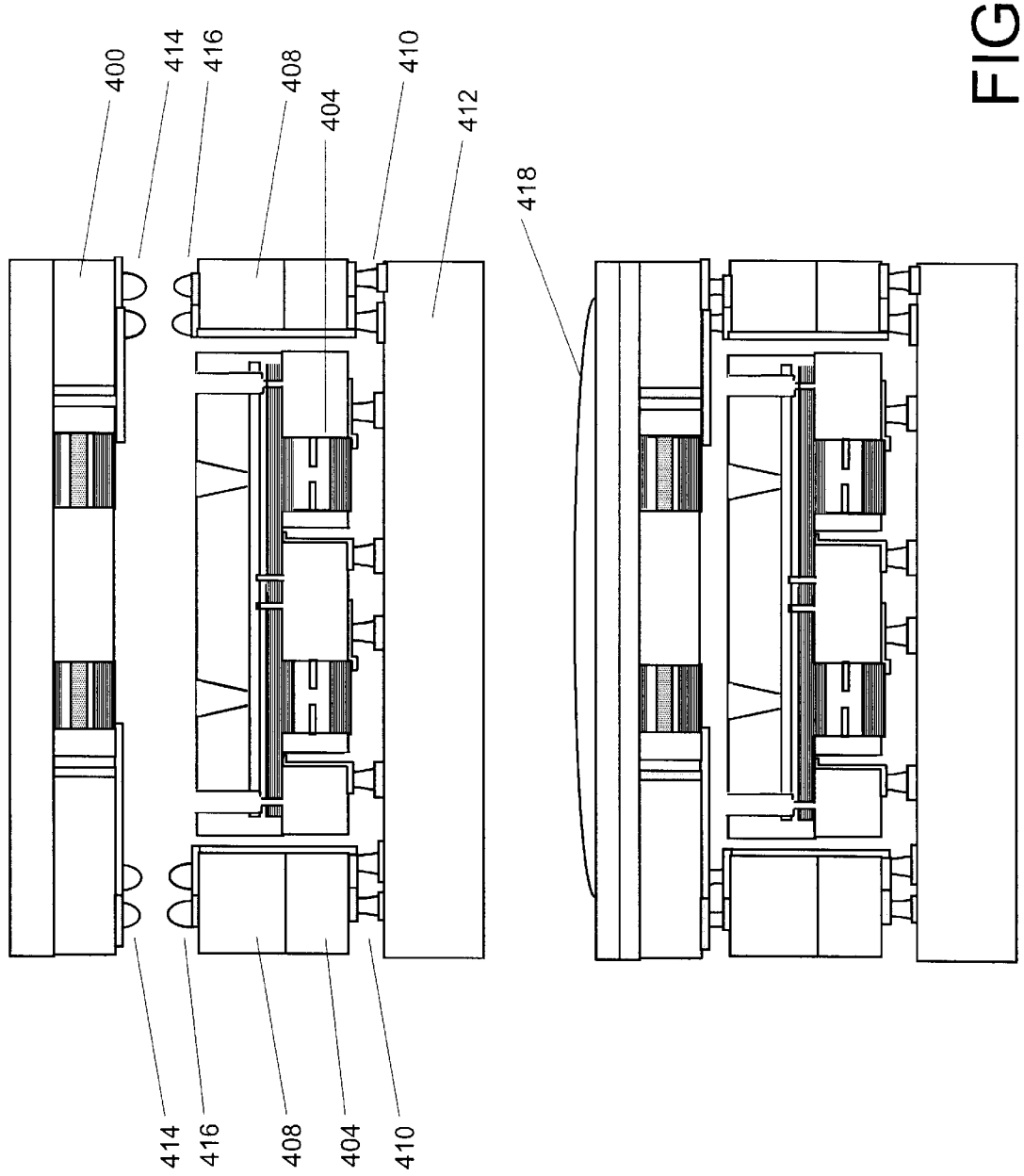
FIG. 4 shows a modulator unit for use with discrete redundant lasers or a single laser having redundant active regions.

FIGS. 2 through 4 show example formats for integration of an individual modulator in an array of modulators, it being understood that the process can be preformed in the same manner on an individual device or wafer scale basis.

FIG. 2 shows a modulator 200 having connections 202, 204 formed for mating with connections 206, 208 on an example integrated laser device 210 previously integrated with an electronic chip 212, in this case a VCSEL. In FIG. 2, the connections for the modulator were made using one of the incorporated by reference topside processes. In the lower half of FIG. 2 the devices after the contacts have mated and been bonded.

FIG. 3 shows an alternative modulator 300 having connections 302, 304 formed for mating with connections 206, 208 on a laser device 210 of FIG. 2, using a back side process of an application incorporated herein by reference, and, in the lower half of the figure, the devices after the contacts have mated and been bonded.

FIG. 4 shows a modulator unit 400, for use with discrete redundant lasers 402, 404 or a single laser having redundant active regions (not shown). In this configuration, separate standoffs 406, 408 are used to physically elevate the contacts 410 of the electronic chip 412 to where the modulator unit's contacts 414 can mate with the elevated contacts 416. Th lower half of the figure shows the modulator unit 400 after it has been located above the lasers 402,404 integrated with the electronic chip 412. In addition, as shown in the lower half of FIG. 4, a lens 418 is mounted on top of the modulator to allow coupling of emitted beams from the lasers with a common fiber or other element (not shown).

As noted in the applications incorporated by reference, preparation and integration processes are slightly different depending upon whether the lasers (or detectors) and modulators are optimized for light emitting from/entering in from the top of the respective devices or the bottom (i.e. backside) of the respective devices, whether or not through a substrate.

Three representative alternative implementations, created according to the processes of the incorporated by reference applications provide for the interconnection between a modulator and a laser. These representative implementations are shown in FIGS. 2 through 4, although other implementations can be made in addition to those shown herein through application of those techniques.

The basic approach comprises:

Integrating lasers in a large array onto an electronic chip. As described in the incorporated by reference applications, this is done using either a) bottom emitting lasers, where a funnel or other opening is etched into the substrate, the substrate is partially or completely removed to allow optical access, or with no substrate removal, if the substrate is optically transparent at the laser's wavelength, or b) top emitting lasers (i.e. emission of the laser is not towards the substrate).

Ensuring that the lasers have "pass-through contacts" which allow electrical connection to be made between the top of the laser wafer piece and the bottom of the modulator piece via contacts on the top of the laser piece and bottom of the modulator piece, without the electrical contacts impacting the performance of the laser itself. In other words, the contacts allow the modulators to be electrically connected to the electronic wafer through the intervening laser wafer).

Creating an array of modulators which allow optical access into and out of the device and have all their electrical contacts on the same side of the wafer piece that will be closest to the lasers and arranged in a configuration that matches with the configuration of the "pass-through contacts" on the laser piece.

Integrating the modulators with the laser wafer piece in a similar way to the way lasers are integrated onto the electronic chip in the array.

A number of schemes for creating the passthrough regions and the formatting of the optical devices (either modulators or lasers) are described in the applications incorporated by reference and as described in the commonly assigned U.S. Provisional Patent Application Serial No. 60/365,998 entitled "Topside Active Optical Device Apparatus And Method", filed Mar. 19, 2002, the entirety of which is incorporated herein by reference.

It should be understood that the modulators can also have a substrate attached to them. Depending upon the particular implementation, a funnel or other opening can therefor be made using one of our techniques (or some other technique) in the substrate, the substrate can be thinned, or the substrate can be left alone if it is optically transparent to the laser below. Moreover, depending upon the particular modulator and its substrate location (i.e. top or backside), the funnel or other opening can be directed toward the lasers or toward the outside world.

Figure 5:
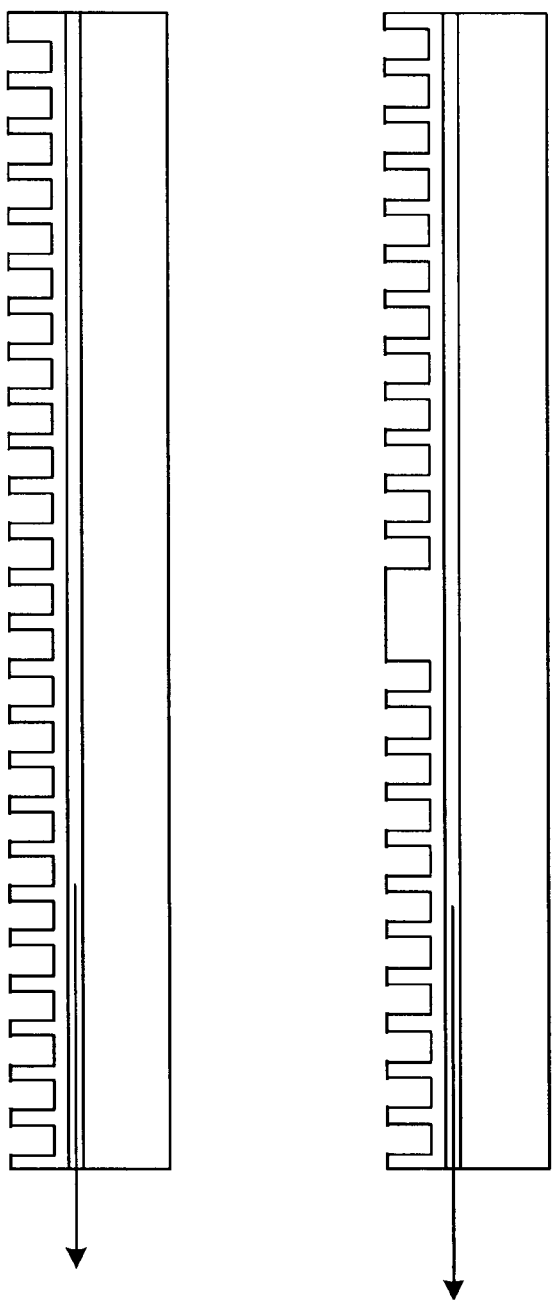
FIG. 5A shows an edge-emitting DFB of the prior art.
FIG. 5B shows an edge-emitting DBR of the prior art.
Figure 6:
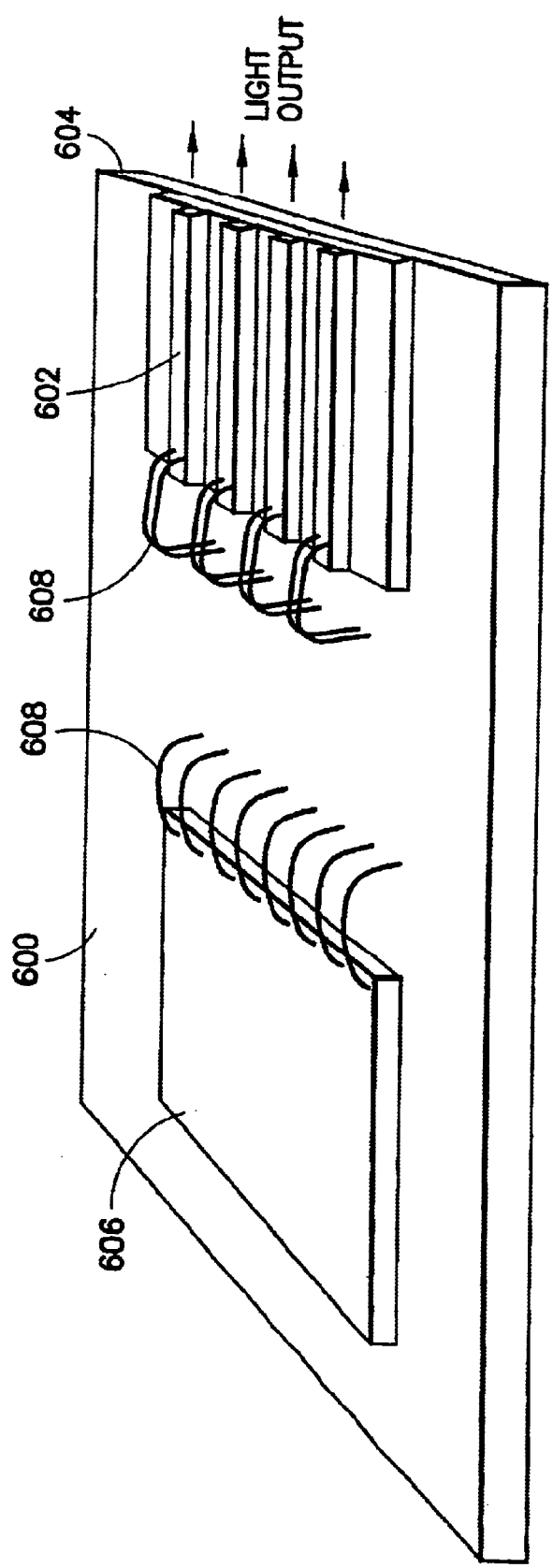
FIG. 6 shows the parallel transceivers created by integrating the devices, one-at-a-time, in a one-dimensional (i.e. linear) array.

While others had proposed using DFB lasers in parallel transceivers, they have typically been thought of and used strictly as edge-emitting devices (i.e. outputting parallel to the plane of the wafer). FIG. 5A shows an edge-emitting DFB of the prior art and FIG. 5B shows an edge-emitting DBR of the prior art. Thus, the parallel transceivers using these edge emitting devices have been created by integrating the devices, one-at-a-time, in a one-dimensional (i.e. linear) array. This is shown in FIG. 6. In FIG. 6, a circuit board 600 has the individual edge emitting array of lasers 602 mounted along its edge 604. An integrated circuit chip 606, containing the driver circuits for the lasers 602, is connected to the lasers 602 by a series of wirebonds 608 via the circuit board 600.

Figure 7:
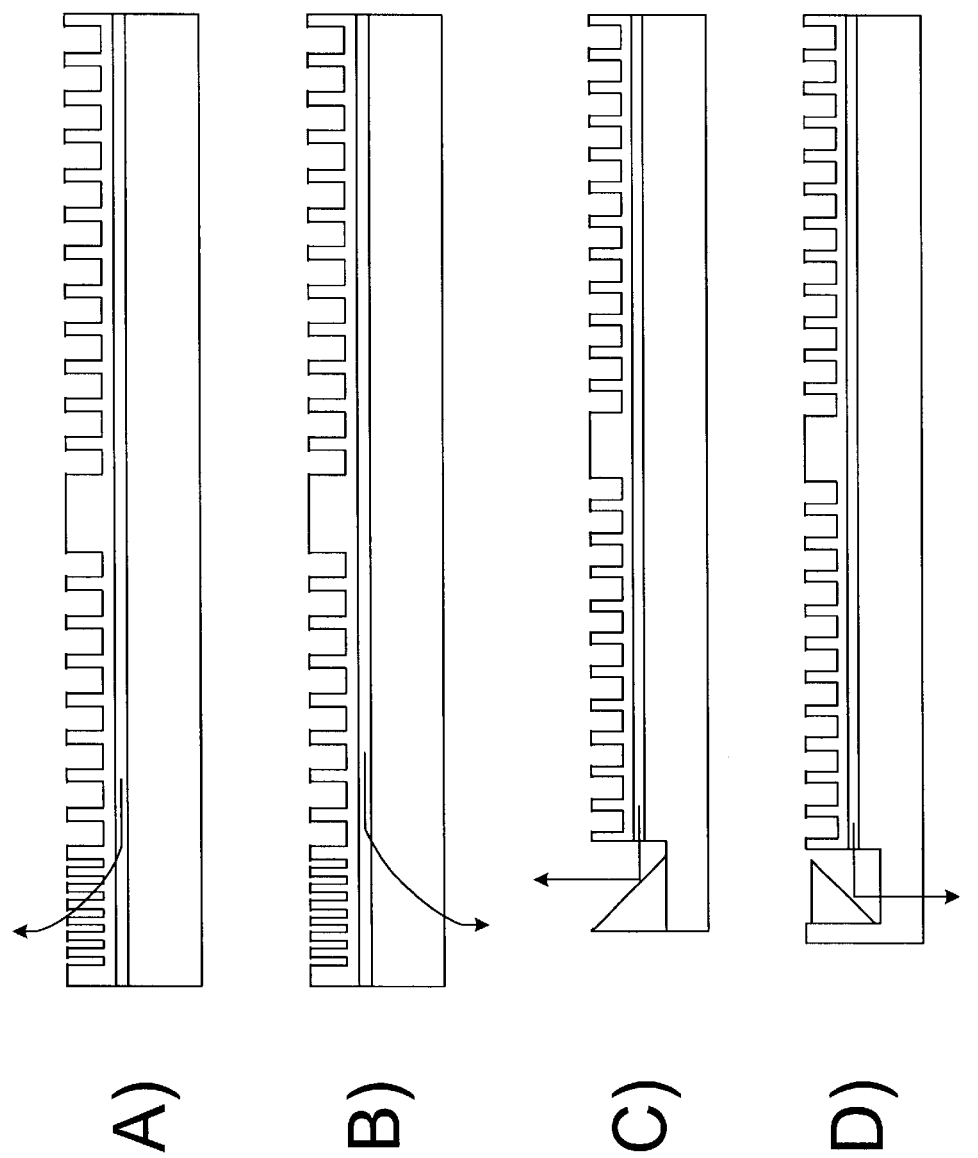
FIG. 7A shows an upwards or "top" emitting grating coupled laser.
FIG. 7B shows a downwards or "bottom" emitting grating coupled laser.
FIG. 7C shows an upwards or "top" emitting micromirror coupled laser.
FIG. 7D shows a downwards of "bottom" emitting micromirror coupled laser.

Since, as noted above, our techniques are usable with any upwards or downwards emitting (or receiving) devices, we recognized that our invention was also usable with grating coupled or angled micromirror coupled DFBs or DBRs, for example, because the grating or micromirror cause their emitted beams to travel perpendicular to the plane of the wafer, such "top" or "bottom" emitting devices having been created by others in the prior art to facilitate on-wafer testing of those devices. FIG. 7A shows an upwards or "top" emitting grating coupled laser of the prior art and FIG. 7B shows a downwards or "bottom" emitting grating coupled laser of the prior art. Similarly, FIG. 7C shows an upwards or "top" emitting micromirror coupled laser of the prior art and FIG. 7D shows a downwards or "bottom" emitting micromirror coupled laser of the prior art.

Figure 8:
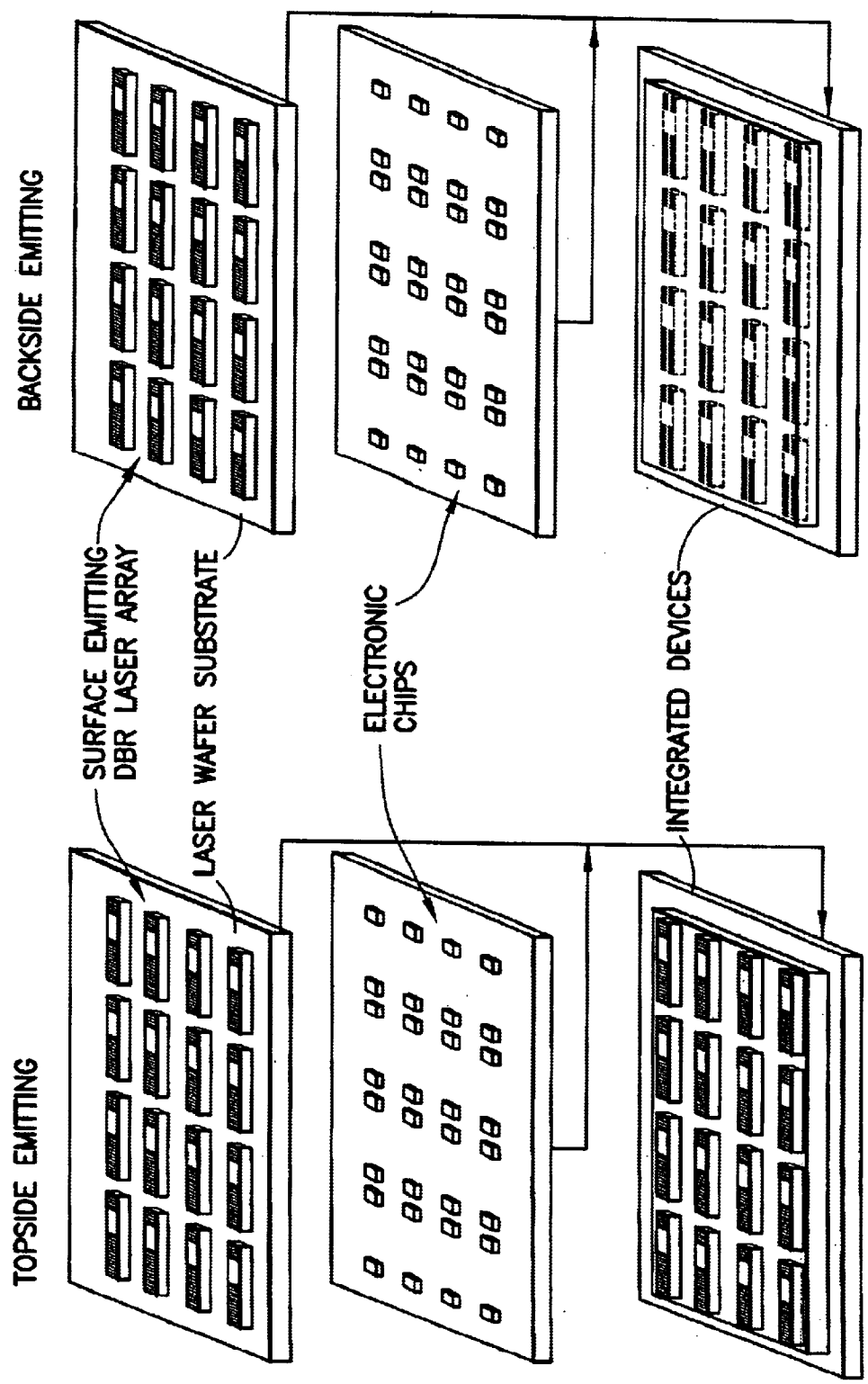
FIG. 8 shows a two-dimensional array and integrated intimately with drive electronics present in the integrated circuit on which they were mounted.

As a result, our approach made it possible for those perpendicular emitting DFBs or DBRs to be configured in a two-dimensional array and integrated intimately with drive electronics present in the integrated circuit on which they were mounted, such as shown in FIG. 8.

Advantageously, as we described, the integration of modulators with lasers is equally valid for a variety of lasers, provided that the light from those lasers eventually emits vertically. Thus, for example, a surface emitting DFB or DBR, such as a grating coupled DFB or a DBR coupled with a mirror, can be used to equal (or greater) effect and/or advantage than achievable with VCSELs.

As described in the incorporated by reference applications referred to above, by applying the teachings of our inventions as described therein, large-format two-dimensional transmitter or transceiver arrays containing VCSEL, DFB or DBR lasers and electronics can be made.

While VCSELs have the advantage of being a more mature and available technology, VCSELs have certain limitations. The output power they can provide is limited. The maturity of longer wavelength VCSELs, for example, at wavelengths of 1.3 microns and beyond, is less than at shorter wavelengths, and the chirp parameter (characterized by the wavelength spread or the change in phase of the output wave during switching) tends to be high. These characteristics limit the usefulness of VCSELs for longer distance data transmission at ultra-high speeds. DFB lasers have superior characteristics which allow longer distance, high-speed data transmission. Accordingly, for long distance data transmission at speeds in excess of 10 Gb/s, DFB lasers are superior to VCSELs.

In contrast to using VCSELs, using our approach with DFBs or DBRs allows large numbers of high-power, narrower linewidth, low chirp, long wavelength lasers to be integrated together on an electronic chip. By doing so, extremely large bandwidth can be achieved (relative to the bandwidth achievable with VCSELs) because resistive losses and/or capacitive slowdowns are minimized. Thus, highly parallel (whether in space or wavelength), low cost, intelligent transmitters or transceivers can be made that can send data over several tens of kilometers which is farther than can be done with other laser technologies, such as VCSELs.

However, as with VCSELs, the desire for ever faster transmission rates means that, at some point, the time the DFB laser needs in order to switch will become longer than the data bit rate transmission time period. Thus, we can also straightforwardly create large arrays of DFB lasers with modulators closely integrated on top to achieve further benefits to those obtained using VCSELs.

By way of brief overview, the process for integrating the DFBs or DBRs with the electronics is the same as described for the specific VCSEL examples in the incorporated by reference applications. The process starts with a laser wafer or wafer piece containing large numbers of surface emitting DFBs or DBRs. These lasers are surface emitting because they have an element near their output, for example a grating or micromirror to couple the light perpendicular to the surface of the wafer (either away from the substrate or into the substrate).

Then, depending upon whether the device is configured to emit away from the substrate (i.e. "top" emitting) or towards it (i.e. "bottom" emitting) the appropriate process is performed as described in detail in the applications incorporated by reference and reiterated in brief below.

If the devices are topside emitting devices: the laser wafer is attached to a carrier; if necessary, the laser wafer substrate is thinned; contacts are pattern etched on the back side of laser wafer in a pattern such that they will match the contacts of the electronic wafer containing the drive circuits; if desired, an encapsulant is optionally flowed between the laser and electronic wafers; and the laser and electronic wafers are attached to each other at the contacts.

If the devices are bottom emitting devices, contacts are pattern etched on the top side of laser wafer so as to match the contacts of the electronic wafer containing the drive circuits; and the laser wafer is then attached to the electronic wafer. Optionally, as with the topside emitting device process, an encapsulant can be flowed between the wafers and/or the laser substrate can be thinned if necessary or desired.

These processes result in integrated devices which contain the various grating coupled DFB lasers integrated with electronics. Although the approach can be performed without them, consistent with semiconductor creation and etching techniques, making these edge-emitting-type laser structures so that they contain etching layers and etch stop layers to help with fabrication of the contact layers and, potentially with the substrate thinning process is beneficial for commercial scale production.

FIG. 8 shows, in summary fashion, the process steps and the end result of the process, which serves as the starting point for the similar process of integrating modulators or detectors on top of the lasers in the array.

Figure 9:
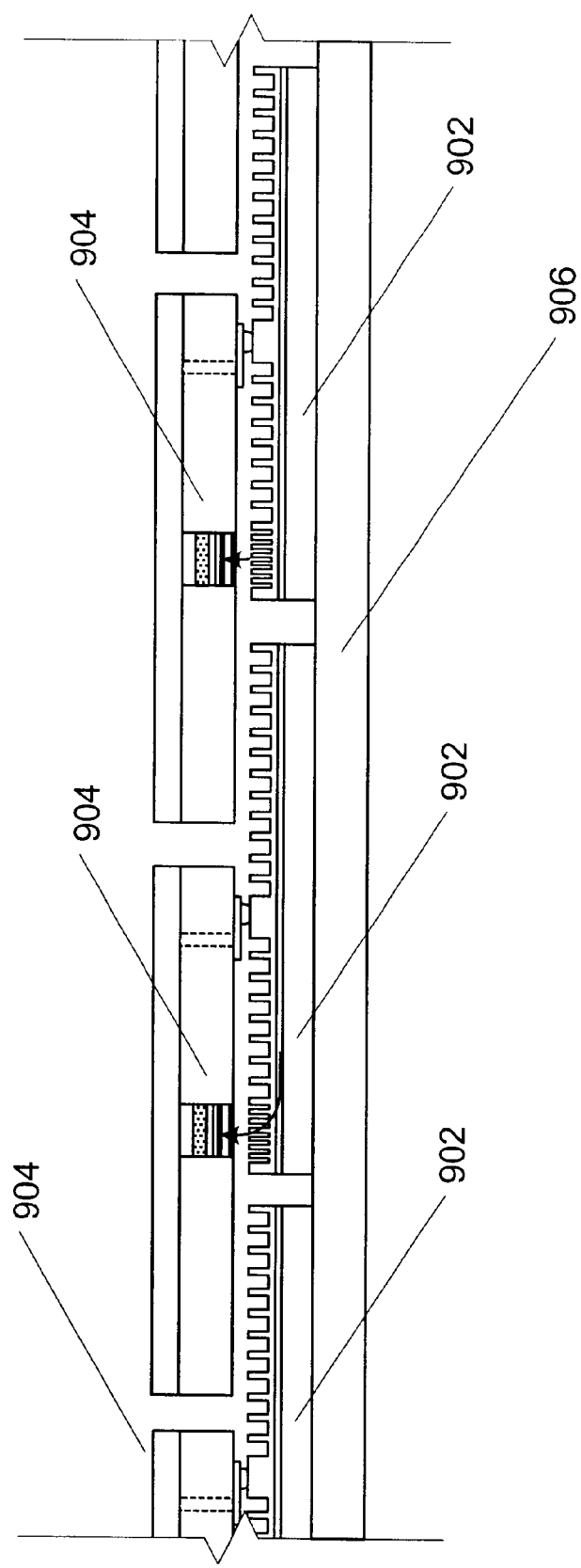
FIG. 9 shows a side view of portion of an integrated unit made up of a two dimensional array of grating coupled DBR lasers integrated with modulators and an electronic integrated circuit by applying the teachings of the invention.

FIG. 9 shows a side view of portion of an integrated unit 900 made up of a two dimensional array of grating coupled DBR lasers 902 integrated with modulators 904 and an electronic integrated circuit 906 by applying the teachings of the invention described in the incorporated applications and herein.

In another variant created according to the teachings of the invention, the modulators can be replaced by detectors that are mostly optically transparent to the laser wavelength and integrated on top of the lasers in a similar manner. Alternatively, the modulators can be operated as detectors to absorb an amount of light from the lasers as the light passes through them. In other variants, both a modulator and detector or two modulators can be stacked above the laser using the same procedures.

In those cases, the detector or modulator would then provide a sampling of the output power from the lasers. The absorbed light will generate a current which can be routed to the integrated circuit and measured. If the power of the laser changes, for example, due to temperature changes or degradation of the laser over time, the absorbed current will change proportionally. As a result, the electronic chip could inject more current into the laser to keep the output power constant or, if redundancy is provided and a laser either could not put out enough power (i.e. it was effectively dead) or died, a backup laser could be switched on its place.

Depending upon the particular implementation and needs, the fixed detector would be used to absorb a small amount of light and let the large majority of light through, in which case the laser would be directly modulated.

In other implementations, the laser is externally modulated, by using the upper device as a modulator and then using a lower modulator to sample the output power by absorbing some of the light, either in the "on" state or the "off" state, or some weighted average of both, for example, where a modulator is transmissive in the "on" state and absorbs in the "off" state; this means the modulator will let light through in the "on" state and block light in the "off" state. However, in actual operation, some amount of light will normally be absorbed, even in the "on" state due to the laws of physics and properties of the devices. As a result, in actual operation, the generated current in the "on" or "off" state, or some average can be used, depending upon which works best in the particular design.

In still other implementations, the devices are arranged in a stack in different orders, for example: a) electronics, detectors, lasers, modulators; b) electronics, lasers, detectors, modulations; or c) electronics, lasers, modulators, detectors.

It should be understood that the above description is only representative of illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A unit comprising:
   an array of lasers, drive electronics and an array of modulators all integrated together to from a structural unit;
   where the array of lasers have an emission surface through which beams can be emitted in a substantially vertical direction so as to define an emission side;
   the drive electronics are connected to a side opposite to the emission side of the array of lasers; and
   the array of modulators are located on the emission side of the array of lasers and connected to the drive electronics.

2. The unit of claim 1 wherein the array of lasers is an array of vertical cavity surface emitting lasers (VCSELs).

3. The unit of claim 2 wherein the VCSELS are top emitting VCSELS.

4. The unit of claim 2 wherein the VCSELS are bottom emitting VCSELS.

5. The unit of claim 1 wherein the array of lasers is an array of distributed feedback (DFB) lasers.

6. The unit of claim 5 wherein the DFB lasers further comprise elements that cause the DFB lasers to emit perpendicular to a wafer plane of the DFB lasers.

7. The unit of claim 6 wherein the elements are gratings that cause the DFB lasers to top emit.

8. The unit of claim 6 wherein the elements are gratings that cause the DFB lasers to bottom emit.

9. The unit of claim 6 wherein the elements are micromirrors that cause the DFB lasers to top emit.

10. The unit of claim 6 wherein the elements are micromirrors that cause the DFB lasers to bottom emit.

11. The unit of claim 1 wherein the array of lasers is an array of distributed Bragg reflector (DBR) lasers.

12. The unit of claim 11 wherein the DBR lasers further comprise elements that cause the DRB lasers to emit perpendicular to a wafer plane of the DBR lasers.

13. The unit of claim 12 wherein the elements are gratings that cause the DBR lasers to top emit.

14. The unit of claim 12 wherein the elements are gratings that cause the DBR lasers to bottom emit.

15. The unit of claim 12 wherein the elements are micromirrors that cause the DBR lasers to top emit.

16. The unit of claim 12 wherein the elements are micromirrors that cause the DBR lasers to bottom emit.

17. The unit of claim 1 wherein the at least some of the modulators are configured for external modulation of the beams.

18. The unit of claim 1 wherein the at least some of the modulators are configured as detectors.

* * * * *

UNITED STATES PATENT AND TRADEMARK OFFICE
CERTIFICATE OF CORRECTION

PATENT NO.    : 6,633,421 B2
DATED         : October 14, 2003
INVENTOR(S)   : John Trezza It is certified that error appears in the above-identified patent and that said Letters Patent is hereby corrected as shown below:

Column 8,
Line 26, "The unit of claim 11 wherein the DBR lasers further comprise elements that cause the DRB lasers to emit perpendicular to a wafer plane of the DBR lasers" should read: -- The unit of claim 11 wherein the DBR lasers further comprise elements that the DBR lasers to emit perpendicular to a wafer plane of the DBR lasers. --

Signed and Sealed this

Eighteenth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,633,421 B2
DATED : October 14, 2003
INVENTOR(S) : John Trezza

It is certified that error appears in the above-identified patent and that said Letters Patent is hereby corrected as shown below:

Title page,
Item "[73], Assignee, Xanoptrix, Inc. Merrimack, NH (US)" should read:
-- [73] Assignee, Xanoptix, Inc. Merrimack, NH (US) --.

Column 7,
Line 37, after "A unit comprising: an array of lasers, drive electronics and an array of modulators all integrated together to from a structural unit;" should read:
-- an array of lasers, drive electronics and an array of modulators all integrated together to form a structural unit --

Signed and Sealed this

Tenth Day of August, 2004

JON W. DUDAS
*Acting Director of the United States Patent and Trademark Office*